United States Patent
Kwon et al.

(10) Patent No.: US 12,424,379 B2
(45) Date of Patent: Sep. 23, 2025

(54) TRANSFORMER AND POWER SUPPLYING DEVICE INCLUDING THE SAME

(71) Applicant: SOLUM CO., LTD., Yongin-si (KR)

(72) Inventors: Chang Yong Kwon, Suwon-si (KR); Dong Kyun Ryu, Seoul (KR); Yun Sic Bang, Uiwang-si (KR); Sang Keun Ji, Yongin-si (KR)

(73) Assignee: SOLUM CO., LTD., Gyeonggi-Do (KR)

( * ) Notice: Subject to any disclaimer, the term of this patent is extended or adjusted under 35 U.S.C. 154(b) by 858 days.

(21) Appl. No.: 17/644,265

(22) Filed: Dec. 14, 2021

(65) Prior Publication Data

US 2023/0049325 A1   Feb. 16, 2023

(30) Foreign Application Priority Data

Aug. 13, 2021   (KR) .................. 10-2021-0107614

(51) Int. Cl.
*H02M 1/42*   (2007.01)
*H01F 27/24*   (2006.01)
(Continued)

(52) U.S. Cl.
CPC .............. *H01F 27/29* (2013.01); *H01F 27/24* (2013.01); *H02M 1/4208* (2013.01);
(Continued)

(58) Field of Classification Search
CPC .......... H01F 27/24; H01F 27/28; H01F 27/29; H01F 27/30; H01F 27/32; H01F 27/306;
(Continued)

(56) References Cited

U.S. PATENT DOCUMENTS 5,696,477 A * 12/1997 Yamamori ............ H01F 27/027
336/185
8,203,414 B2 * 6/2012 Tao ...................... H01F 27/326
336/170

(Continued)

FOREIGN PATENT DOCUMENTS

EP        4095871 B1 *   7/2024 ............. H01F 17/04
KR   1020170142261       12/2017
(Continued)

OTHER PUBLICATIONS

English Translation of EP 4095871 (Year: 2024).*

*Primary Examiner* — Sean Kayes
*Assistant Examiner* — Nusrat Quddus
(74) *Attorney, Agent, or Firm* — Perman & Green, LLP

(57) ABSTRACT

A transformer includes: a magnetic core including a lower magnetic structure and an upper magnetic structure; a printed circuit board arranged between the lower magnetic structure and the upper magnetic structure and including a core hole through which a midsection of the magnetic core penetrates, a primary coil, a secondary coil, a primary via-hole formed at an end of the printed circuit board and electrically connected to the primary coil, and a secondary via-hole formed at another end of the printed circuit board and electrically connected to the secondary coil; a primary pin inserted into the primary via-hole; a secondary pin inserted into the secondary via-hole; an insulating block into which a portion of the printed circuit board is inserted; and a mount on which the printed circuit board and the insulating block are mounted.

18 Claims, 12 Drawing Sheets

(51) Int. Cl.
  *H01F 27/29* (2006.01)
  *H05K 1/11* (2006.01)
  *H05K 1/18* (2006.01)
(52) U.S. Cl.
  CPC .............. *H05K 1/115* (2013.01); *H05K 1/184* (2013.01); *H05K 2201/1003* (2013.01)
(58) Field of Classification Search
  CPC ............. H01F 27/324; H01F 2005/022; H01F 2017/0086; H01F 2027/2809; H01F 2027/2819; H01F 2027/2814; H05K 1/115; H05K 1/184
  See application file for complete search history.

(56) References Cited

U.S. PATENT DOCUMENTS

| | | | | |
|---|---|---|---|---|
| 12,094,640 | B2* | 9/2024 | Yang | H01F 27/325 |
| 2006/0006975 | A1* | 1/2006 | Jitaru | H01F 27/2804 |
| | | | | 336/212 |
| 2009/0009276 | A1* | 1/2009 | Jidaisho | H01F 27/027 |
| | | | | 336/90 |
| 2009/0278646 | A1* | 11/2009 | Chen | H01F 27/325 |
| | | | | 336/177 |
| 2011/0254648 | A1* | 10/2011 | Chan | H01F 27/29 |
| | | | | 336/131 |
| 2013/0328655 | A1* | 12/2013 | Catalano | H05K 3/30 |
| | | | | 336/200 |
| 2014/0266553 | A1* | 9/2014 | Chen | B65H 75/4402 |
| | | | | 242/118 |
| 2015/0061805 | A1* | 3/2015 | Eom | H01F 27/2847 |
| | | | | 336/200 |
| 2015/0279547 | A1* | 10/2015 | Park | H05K 1/165 |
| | | | | 336/200 |
| 2017/0032888 | A1* | 2/2017 | Park | H01F 27/325 |
| 2020/0161043 | A1* | 5/2020 | Chou | H01F 27/292 |
| 2020/0265987 | A1 | 8/2020 | Hu et al. | |
| 2021/0327638 | A1* | 10/2021 | Kwon | H01F 27/34 |
| 2022/0059275 | A1* | 2/2022 | Lee | H01F 27/2804 |

FOREIGN PATENT DOCUMENTS

| | | |
|---|---|---|
| KR | 101984631 | 5/2019 |
| KR | 1020200040645 | 4/2020 |
| WO | 2020230960 | 11/2020 |

\* cited by examiner

TRANSFORMER AND POWER SUPPLYING DEVICE INCLUDING THE SAME

CROSS-REFERENCE TO RELATED APPLICATIONS

This application is based on and claims priority under 35 U.S.C. § 119 to Korean Patent Application No. 10-2021-0107614, filed on Aug. 13, 2021, in the Korean Intellectual Property Office, the disclosure of which is incorporated by reference herein in its entirety.

BACKGROUND

1. Field

One or more embodiments relate to a transformer and a power supplying device including the same.

2. Description of the Related Art

A switching mode power supply (SMPS) has been used as a device for supplying power to various electronic devices. The SMPS may provide stable power to various electronic devices by using a switching device, such as a metal-oxide semiconductor field-effect transistor (MOSFET) or a bipolar junction transistor (BJT), and a transformer.

As transformers have been developed, the size and weight thereof have been reduced. However, a predetermined distance may still have to be ensured between a primary coil and a secondary coil for the electrical stability during operation, and thus, there has been a limit for miniaturization of the transformers. Thus, Patent No. 10-2017-0142261 (Transformer for a charger with an improved insulation structure) discloses a technique for obtaining an insulation distance while miniaturizing a transformer by using a printed circuit board including a primary coil and a secondary coil and a spacer block.

SUMMARY

One or more embodiments include a transformer including a printed circuit board with an improved electrical stability and a power supplying device including the transformer.

Additional aspects will be set forth in part in the description which follows and, in part, will be apparent from the description, or may be learned by practice of the presented embodiments of the disclosure.

According to one or more embodiments, a transformer includes: a magnetic core including a lower magnetic structure and an upper magnetic structure; a printed circuit board arranged between the lower magnetic structure and the upper magnetic structure and including a core hole through which a midsection of the magnetic core penetrates, a primary coil, a secondary coil, a primary via-hole formed at an end of the printed circuit board and electrically connected to the primary coil, and a secondary via-hole formed at another end of the printed circuit board and electrically connected to the secondary coil; a primary pin inserted into the primary via-hole; a secondary pin inserted into the secondary via-hole; an insulating block into which a portion of the printed circuit board is inserted; and a mount on which the printed circuit board and the insulating block are mounted.

A fixing groove may be provided in an area of the mount adjacent to the primary via-hole, the fixing groove being formed such that the primary pin penetrates the fixing groove and having a shape that is open in a direction crossing a direction in which the primary pin penetrates the fixing groove.

The fixing groove may include a U shape.

The mount may include: a base adjacent to a bottom surface of the printed circuit board; a first left side wall and a first right side wall upwardly extending on left and right ends of the base, respectively, to be adjacent to a left side surface and a right side surface of the printed circuit board; a rear wall upwardly extending on a rear side of the base and including a mount opening into which the printed circuit board is inserted; and a front protrusion structure extending from a front end of the base in a front direction and including the fixing groove.

The fixing groove may have the open structure in the front direction at the front protrusion structure.

The mount may further include a rear protrusion structure extending from the rear wall in a rear direction so as to form a space for accommodating a portion of the printed circuit board, the portion being inserted into the mount opening of the rear wall and protruding in the rear direction.

The rear protrusion structure may include a second left side wall and a second right side wall respectively extending on left and right sides of the rear wall in the rear direction and an upper wall and a lower wall respectively extending on upper and lower portions of the rear wall in the rear direction.

A through-hole may be provided in the lower wall, and the secondary pin may be inserted into the through-hole.

The upper wall may be inclined from the rear wall in a lower direction.

The insulating block may cover an area of the printed circuit board, the area being between the core hole and the secondary via-hole.

The insulating block may include a flat vertical plate arranged in parallel with the rear wall and including a block opening into which the portion of the printed circuit board is inserted; and an insulating upper wall, an insulating lower wall, an insulating left side wall, and an insulating right side wall extending from the vertical plate in the front direction to surround the block opening.

The insulating upper wall may cover a first area between the core hole and the secondary via-hole on a top surface of the printed circuit board, and the insulating lower wall may cover a second area between the core hole and the secondary via-hole on a bottom surface of the printed circuit board.

A step-difference structure may be provided on an upper portion of the rear wall.

The insulating block may further include a first insertion portion extending on an upper portion of a rear surface of the vertical plate in a rear direction so as to be inserted into the step-difference structure.

An insertion groove may be provided in a front surface of the rear wall to extend from the top to the bottom.

The insulating block may further include a second insertion portion protruding on a rear surface of the vertical plate in a rear direction and extending from top to bottom so as to be inserted into the insertion groove.

The secondary via-hole may have an open structure in a rear direction of the printed circuit board.

An end of the printed circuit board, at which the primary via-hole is provided, may protrude from the magnetic core in a first direction, and another end of the printed circuit board at which the secondary via-hole is provided may protrude from the magnetic core in a second direction that is opposite to the first direction.

The lower magnetic structure may include a first midsection, a first magnetic plate on which the first midsection is provided, and a pair of first side wall portions provided on the first magnetic plate to be apart from each other with the first midsection therebetween and to face each other, and the upper magnetic structure may include a second midsection, a second magnetic plate on which the second midsection is provided, and a pair of second side wall portions provided on the second magnetic plate to be apart from each other with the second midsection therebetween and to face each other.

The first magnetic plate may include a first step-difference structure contacting a lower portion of the insulating block, and the second magnetic plate may include a second step-difference structure contacting an upper portion of the insulating block.

According to one or more embodiments, a power supplying device includes: a rectifier configured to rectify an alternating current voltage applied from outside; and the transformer configured to modulate the voltage rectified by the rectifier.

The power supplying device may further include a power factor improving circuit configured to improve a power factor with respect to the transformer.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
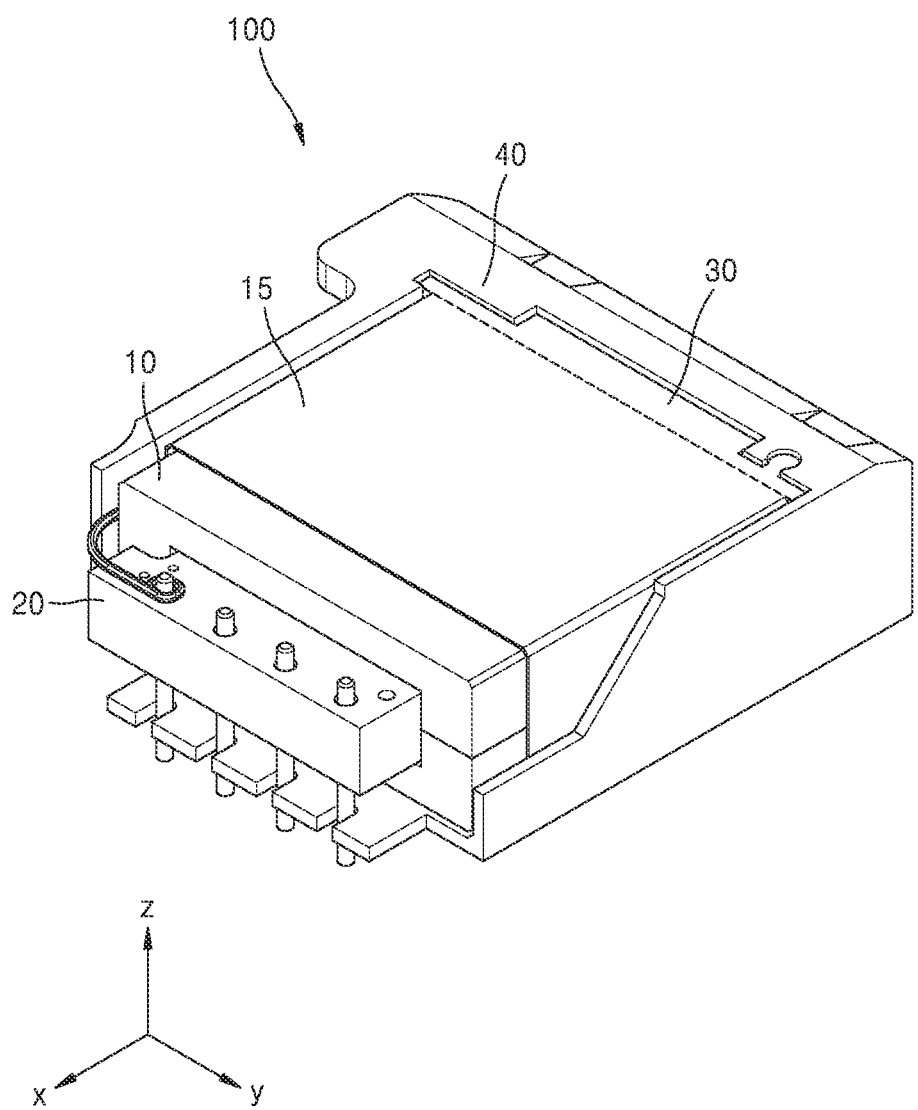
FIG. 1 is a perspective view of an example structure of a transformer according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

In the drawings, sizes or thicknesses of elements may be exaggerated for clarity and convenience of explanation.

Hereinafter, it will be understood that when an element is referred to as being "on" or "above" another element, the element can be directly over or under the other element and directly on the left or on the right of the other element, or intervening elements may also be present therebetween. As used herein, the singular terms "a" and "an" are intended to include the plural forms as well, unless the context clearly indicates otherwise. It will be further understood that when a part "includes" or "comprises" an element, unless otherwise defined, the part may further include other elements, not excluding the other elements.

The term "the" and other equivalent determiners may correspond to a singular referent or a plural referent. Operations included in a method may be performed in an appropriate order, unless the operations included in the method are described to be performed in an apparent order, or unless the operations included in the method are described to be performed otherwise. The operations are not necessarily limited to the described order.

Although the terms first, second, etc. may be used herein to describe various elements, these terms do not limit the components. These terms are only used to distinguish one element from another.

FIG. 1 is a perspective view of an example structure of a transformer 100 according to an embodiment.

Figure 2:
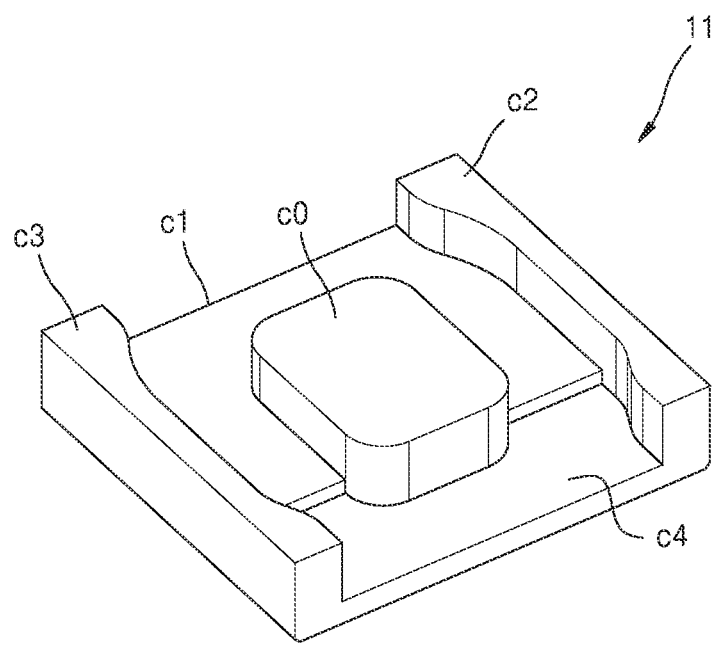
FIG. 2 is a perspective view of an example structure of a lower magnetic structure included in the transformer of FIG. 1.

FIG. 2 is a perspective view of an example structure of a lower magnetic structure 11 included in the transformer 100 of FIG. 1.

Figure 3:
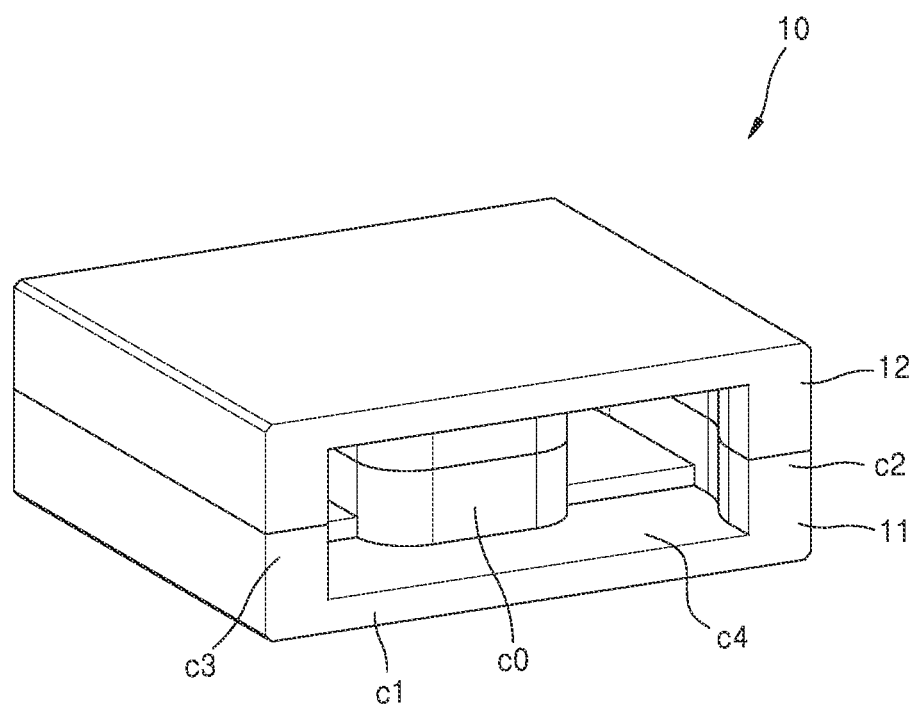
FIG. 3 is a perspective view of an example structure of a magnetic core included in the transformer of FIG. 1.

FIG. 3 is a perspective view of an example structure of a magnetic core 10 included in the transformer 100 of FIG. 1.

Figure 4:
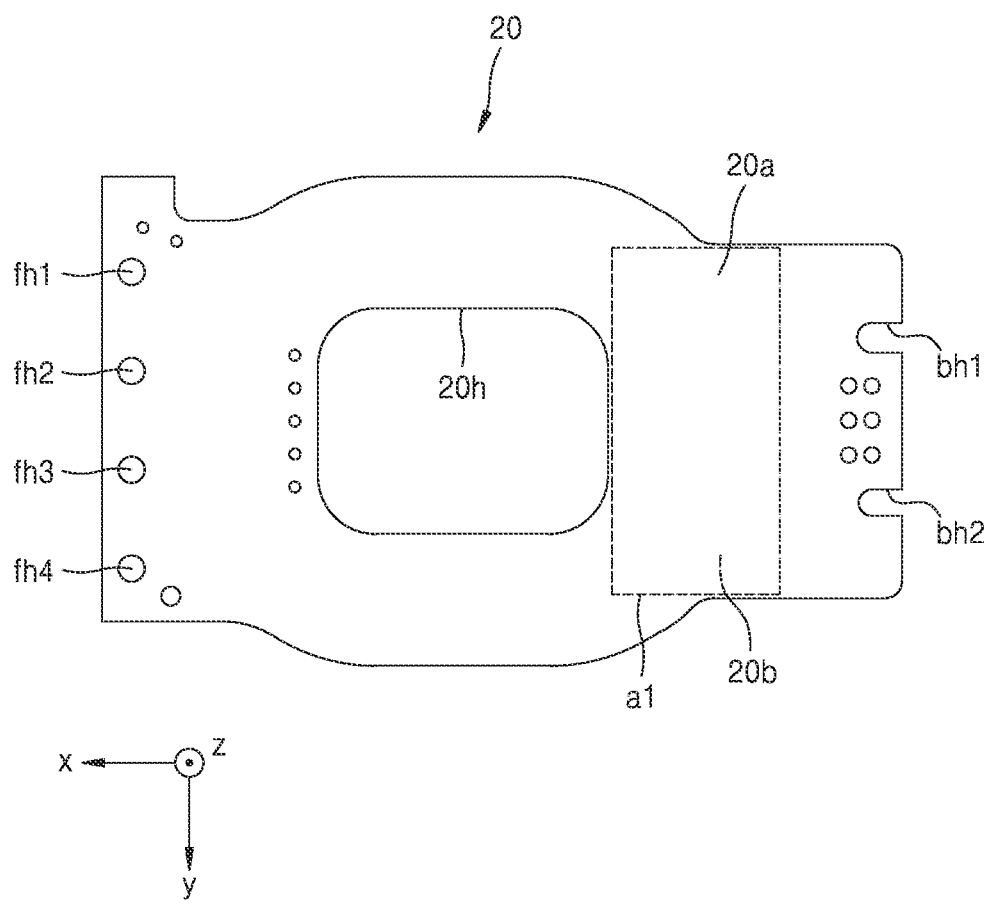
FIG. 4 is a plan view of an example structure of a printed circuit board included in the transformer of FIG. 1.

FIG. 4 is a plan view of an example structure of a printed circuit board 20 included in the transformer 100 of FIG. 1.

Figure 5:
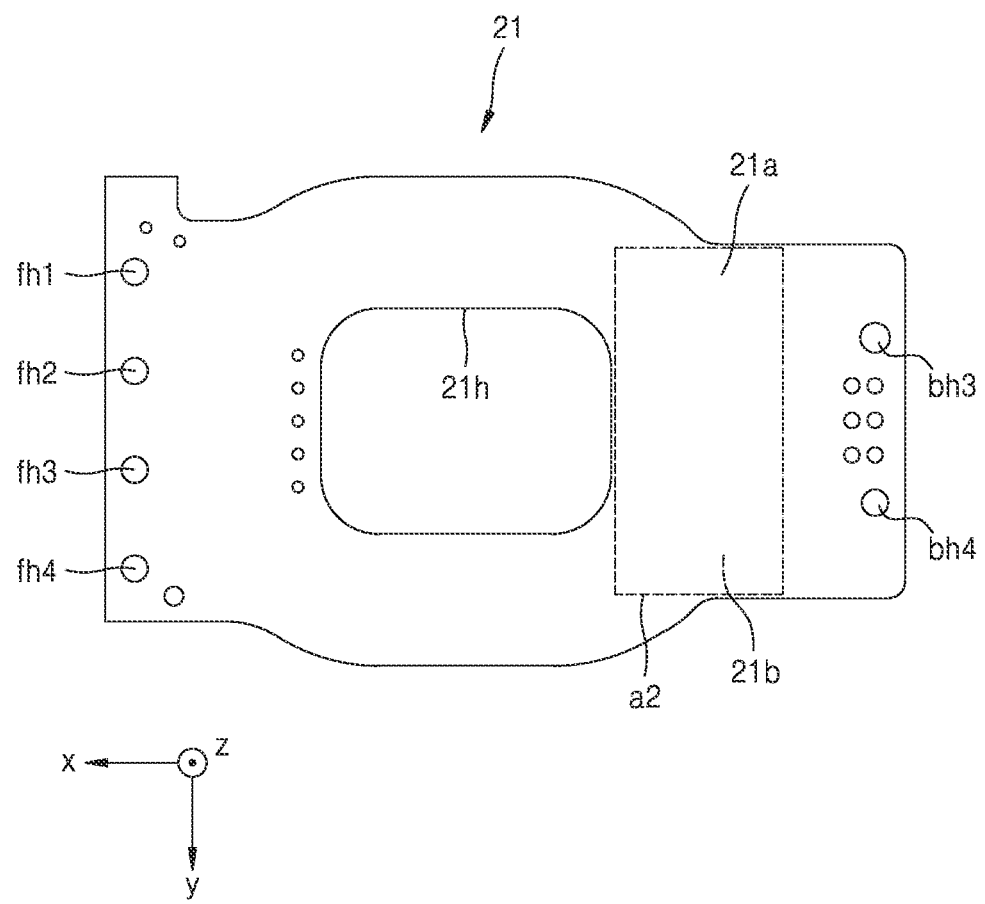
FIG. 5 is a plan view of another example structure of the printed circuit board included in the transformer of FIG. 1.

FIG. 5 is a plan view of another example structure of the printed circuit board 20 included in the transformer 100 of FIG. 1.

Figure 6:
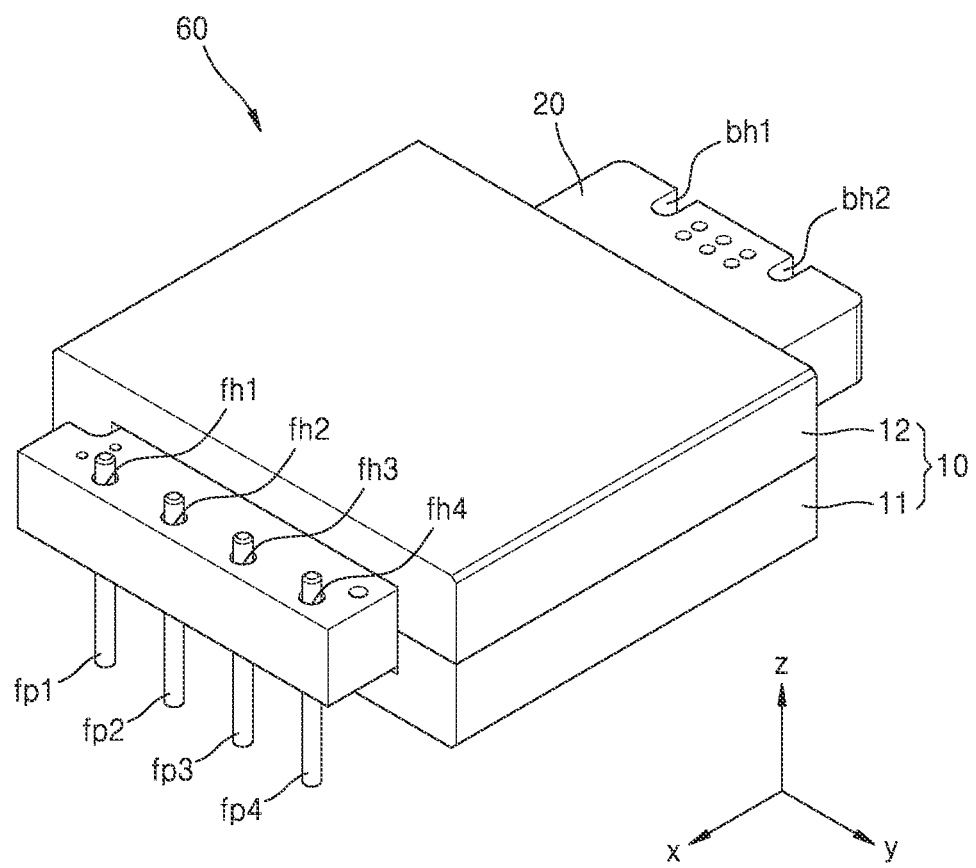
FIG. 6 is a perspective view of an example structure of a first assembly in which the magnetic core of FIG. 3 and the printed circuit board of FIG. 4 are coupled to each other.

FIG. 6 is a perspective view of an example structure of a first assembly 60 in which the magnetic core 10 of FIG. 3 and the printed circuit board 20 of FIG. 4 are coupled to each other.

Referring to FIG. 1, the transformer 100 may include the magnetic core 10 having a magnetic property, a printed circuit board 20, a portion of which is arranged in the magnetic core 10, and which includes a primary coil and a secondary coil having a magnetic field via currents applied from the outside, an insulating block 30 formed such that a portion of the printed circuit board 20 is inserted into the insulating block 30, and a mount 40 on which the printed circuit board 20 and the insulating block 30 are mounted. Further, the transformer 100 may further include primary pins (fp1, fp2, fp3, and fp4 of FIG. 10) and secondary pins (bp1 and bp2 of FIG. 11) coupled to the printed circuit board 20. Further, the mount 40 may include fixing grooves (mfh1, mfh2, mfh3, and mfh4 of FIG. 8) formed such that the primary pins fp1, fp2, fp3, and fp4 may penetrate the fixing grooves mfh1, mfh2, mfh3, and mfh4 and having a U shape that is open in a direction crossing a direction in which the primary pins fp1, fp2, fp3, and fp4 may penetrate the fixing grooves mfh1, mfh2, mfh3, and mfh4.

The magnetic core 10 may be a member having a magnetic property and may facilitate the electromagnetic induction between the primary coil and the secondary coil of the printed circuit board 20. Referring to FIG. 3, the magnetic core 10 may include a lower magnetic structure 11 and an upper magnetic structure 12 facing each other in an upper and lower direction (a z direction of FIG. 1). The lower magnetic structure 11 and the upper magnetic structure 12 may be provided such that a midsection of each of the lower magnetic structure 11 and the upper magnetic structure 12 may face each other in the upper and lower direction (the z direction).

Referring to FIG. 2, the lower magnetic structure 11 may include a first midsection c0 having a cylindrical shape, a first magnetic plate c1 on which the first midsection c0 is provided, and a pair of first side wall portions c2 and c3 provided on the first magnetic plate c1 to be apart from each other with the first midsection c0 therebetween and to face each other. The first midsection c0, the first magnetic plate c1, and the pair of first side wall portions c2 and c3 may be integrally formed with one another.

The first midsection c0 may be formed on a center of a surface of the first magnetic plate c1 to extend in a vertical direction. Also, the pair of first side wall portions c2 and c3 may be formed on edges of a surface of the first magnetic plate c1 to extend in a vertical direction.

Each of the pair of first side wall portions c2 and c3 may have the same height as each other. The height of the pair of first side wall portions c2 and c3 may be greater than a height of the first midsection c0. However, the height of the pair of first side wall portions c2 and c3 is not limited thereto and may be the same as the height of the first midsection c0. Also, the first magnetic plate c1 may include a first step-difference structure c4 contacting a lower portion of the insulating block 30. For example, an area of the surface of the first magnetic plate c1, on which the first midsection c0 and the pair of first side wall portions c2 and c3 are provided, may have a less thickness than another area. As described above, the area of the surface of the first magnetic plate c1, the area having a relatively less thickness than the other area, may be referred to as the first step-difference structure c4.

A structure of the upper magnetic structure 12 may be substantially the same as a structure of the lower magnetic structure 11 described with reference to FIG. 2. However, while the first step-difference structure c4 of the lower magnetic structure 11 contacts the lower portion of the insulating block 30, a second step-difference structure included in the upper magnetic structure 12 may contact an upper portion of the insulating block 30, because the upper magnetic structure may be arranged above the lower magnetic structure 11.

A midsection of the lower magnetic structure 11 and a midsection of the upper magnetic structure 12 may penetrate the center of the printed circuit board 20. For example, when currents flow in the primary coil included in the printed circuit board 20, a change in magnetic flux may occur around the primary coil. A degree of the change in magnetic flux occurring around the primary coil may be further intensified by the midsection of the lower magnetic structure 11 and the midsection of the upper magnetic structure 12.

Referring to FIG. 1 again, the lower magnetic structure 11 and the upper magnetic structure 12 may be coupled to each other via a coupling tape 15 surrounding an outer circumferential surface of the lower magnetic structure 11 and the upper magnetic structure 12. However, it is not limited thereto. The lower magnetic structure 11 and the upper magnetic structure 12 may be coupled to each other via insertion of an adhesion material between the lower magnetic structure 11 and the upper magnetic structure 12.

The printed circuit board 20 may include the primary coil and the secondary coil. Referring to FIG. 4, a core hole 20h through which a midsection of the magnetic core 10 penetrates may be formed in the center of the printed circuit board 20. The midsection of the lower magnetic structure 11 and the midsection of the upper magnetic structure 12 may penetrate through the core hole 20h to face each other.

The printed circuit board 20 may include primary via-holes fh1, fh2, fh3, and fh4 formed in an end thereof and secondary via-holes bh1 and bh2 formed in another end thereof. The primary via-holes fh1, fh2, fh3, and fh4 may be electrically connected with the primary coil. For example, the primary via-holes fh1, fh2, fh3, and fh4 may include a first primary via-hole fh1, a second primary via-hole fh2, a third primary via-hole fh4, and a fourth primary via-hole fh4. However, it is not limited thereto, and the number of primary via-holes included in the printed circuit board 20 may be more or less than four.

The secondary via-holes bh1 and bh2 may be electrically connected with the secondary coil. For example, the secondary via-holes bh1 and bh2 may include a first secondary via-hole bh1 and a second secondary via-hole bh2. However, it is not limited thereto, and the number of secondary via-holes included in the printed circuit board 20 may be more or less than two.

The end of the printed circuit board 20, in which the first through fourth primary via-holes fh1, fh2, fh3, and fh4 are formed, may extend in a first direction (an x direction). The other end of the printed circuit board 20, in which the first and second secondary via-holes bh1 and bh2 are formed, may extend in a direction (a −x direction) which is the opposite to the first direction (the x direction). In this case, the first direction (the x direction) may be defined as the front direction, and the direction (the −x direction) opposite to the first direction (the x direction) may be defined as the rear direction.

Referring to FIG. 4, The first through fourth primary via-holes fh1, fh2, fh3, and fh4 may be arranged in an end of the printed circuit board 20 to be apart from each other by a predetermined distance. The first through fourth primary via-holes fh1, fh2, fh3, and fh4 may be formed to penetrate the printed circuit board 20 from the top to the bottom and may have a closed structure in a side direction which is parallel to an x-y plane.

The first and second secondary via-holes bh1 and bh2 may be arranged in an end of the printed circuit board 20 to be apart from each other by a predetermined distance. The first and second secondary via-holes bh1 and bh2 may be formed to penetrate the printed circuit board 20 from the top to the bottom. Unlike the first through fourth primary via-holes fh1, fh2, fh3, and fh4, the first and second secondary via-holes bh1 and bh2 may have an open structure in a rear direction (the −x direction). However, the printed circuit board 20 is not limited thereto, and as illustrated in FIG. 5, a printed circuit board 21 according to another embodiment may include secondary via-holes bh3 and bh4 having a closed structure in a side direction including the rear direction (the −x direction).

Referring to FIG. 6, the first assembly 60 may be formed by coupling the magnetic core 10 with the printed circuit board 20. The printed circuit board 20 may be arranged between the lower magnetic structure 11 and the upper magnetic structure 12. The midsection of the lower magnetic structure 11 and the midsection of the upper magnetic structure 12 may be inserted into the core hole 20h of the printed circuit board 20, and first and second side wall portions of the lower magnetic structure 11 and the upper magnetic structure 12 may surround side surfaces of the printed circuit board 20.

The end of the printed circuit board 20, in which the first through fourth primary via-holes fh1, fh2, fh3, and fh4 are provided, may protrude from the magnetic core 10 in the first direction (the x direction), and the other end of the printed circuit board 20, in which the first and second secondary via-holes bh1 and bh2 are provided, may protrude from the magnetic core 10 in a second direction (the −x direction) which is the opposite to the first direction (the x direction). In this case, the first direction (the x direction) may be referred to as the front direction, and the second direction (the −x direction) may be referred to as the rear direction.

Primary pins fp1, fp2, fp3, and fp4 may be inserted into the first through fourth primary via-holes fh1, fh2, fh3, and fh4 of the printed circuit board 20. For example, a first primary pin fp1 may be inserted into the first primary via-hole fh1, a second primary pin fp2 may be inserted into the second primary via-hole fh2, a third primary pin fp3 may be inserted into the third primary via-hole fh3, and a fourth primary pin fp4 may be inserted into the fourth primary via-hole fh4. The first through fourth primary pins fp1, fp2, fp3, and fp4 may include a conductive material. Also, an adhesion member, such as a solder ball, etc., filling an empty space between the first through fourth primary via-holes fh1, fh2, fh3, and fh4 and the first through fourth primary pins fp1, fp2, fp3, and fp4, may further be provided.

Figure 7:
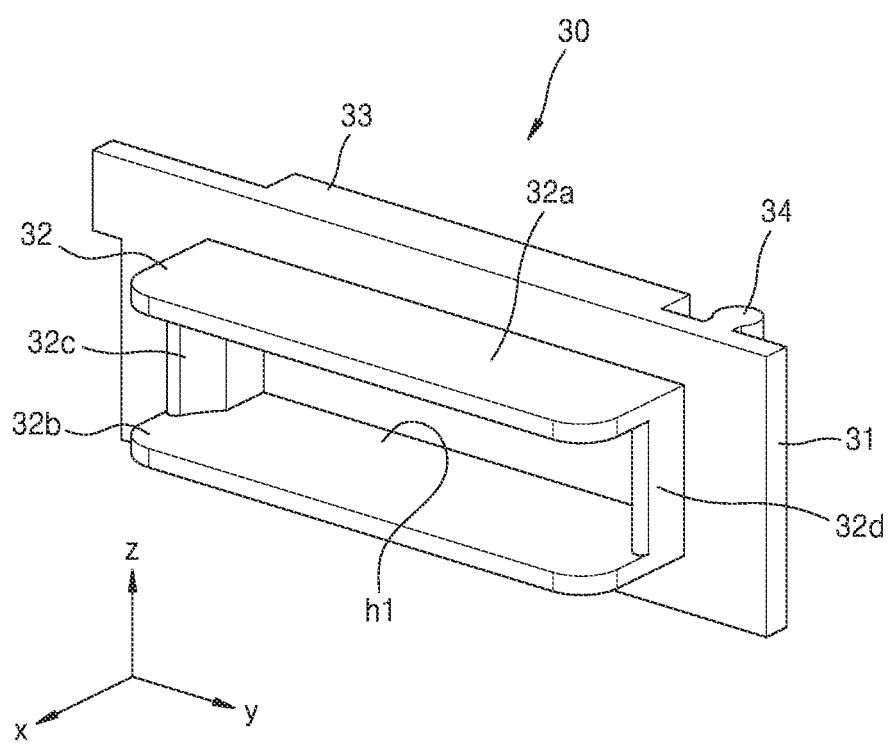
FIG. 7 is a perspective view of an example structure of an insulating block included in the transformer of FIG. 1.

The insulating block 30 may be mounted on the mount 40 to cover a portion of the printed circuit board 20. For example, the insulating block 30 may cover a portion of an area of the printed circuit board 20, the area being adjacent to the first and second secondary via-holes bh1 and bh2. Referring to FIG. 7, the insulating block 30 may include: a flat vertical plate 31 including a block opening h1 into which a portion of the printed circuit board 20 is inserted; and an insulating upper wall 32a, an insulating lower wall 32b, an insulating left side wall 32c, and an insulating right side wall 32d, extending from the vertical plate 31 in a front direction (the x direction) to surround the block opening h1. The insulating upper wall 32a, the insulating lower wall 32b, the insulating left side wall 32c, and the insulating right side wall 32d may be integrally formed with one another. A structure in which the insulating upper wall 32a, the insulating lower wall 32b, the insulating left side wall 32c, and the insulating right side wall 32d are integrally formed with one another may be referred to as an insulating wall 32.

Referring to FIGS. 4 and 7, the insulating upper wall 32a may cover a first area a1 between the core hole 20h and the first and second secondary via-holes bh1 and bh2, on an upper surface 20a of the printed circuit board 20. Similarly, the insulating lower wall 32b may cover a second area between the core hole 20h and the first and second secondary via-holes bh1 and bh2, on a lower surface 20b of the printed circuit board 20, the lower surface 20b facing the upper surface 20a of the printed circuit board 20. The second area may be an area of the lower surface 20b of the printed circuit board 20 and may be an area facing the first area a1. Also, referring to FIGS. 5 and 7, the insulating upper wall 32a may cover a first area a2 between a core hole 21h and the secondary via-holes bh3 and bh4, on an upper surface 21a of the printed circuit substrate 21. Similarly, the insulating lower wall 32b may cover a second area between the core hole 21h and the secondary via-holes bh3 and bh4, on a lower surface 21b of the printed circuit board 21, the lower surface 21b facing the upper surface 21a of the printed circuit board 21. The second area may be an area of the lower surface 21b of the printed circuit board 21 and may be an area facing the first area a2.

The insulating left side wall 32c may cover an area between the core hole 20h and the first and second secondary via-holes bh1 and bh2, on a left side surface of the printed circuit board 20. Similarly, the insulating right side wall 32d may cover an area between the core hole 20h and the first and second secondary via-holes bh1 and bh2, on a right side surface of the printed circuit board 20. For example, the insulating left side wall 32c and the insulating right side wall 32d may contact the first and second side wall portions of the magnetic core 10 that surround the side surfaces of the printed circuit board 20. As described above, because the insulating left side wall 32c and the insulating right side wall 32d may be provided between the first and second secondary via-holes bh1 and bh2 and the first and second side wall portions of the magnetic core 10, a sufficient insulating distance may be obtained between the first and second secondary via-holes bh1 and bh2 and the first and second side wall portions of the magnetic core 10 without increasing a size of the printed circuit board 20.

The insulating block 30 may further include a first insertion portion 33 extending on an upper portion of a rear surface of the vertical plate 31 in the rear direction (the −x direction). For example, the first insertion portion 33 may include a flat structure extending on the upper portion of the rear surface of the vertical plate 31 in the rear direction (−x direction). Also, the insulating block 30 may further include a second insertion portion 34 protruding on the rear surface of the vertical plate 31 in the rear direction and extending from the top to the bottom. For example, the second insertion portion 34 may include a cylindrical structure protruding from the rear surface of the vertical plate 31 in the rear direction (the −x direction).

Figure 8:
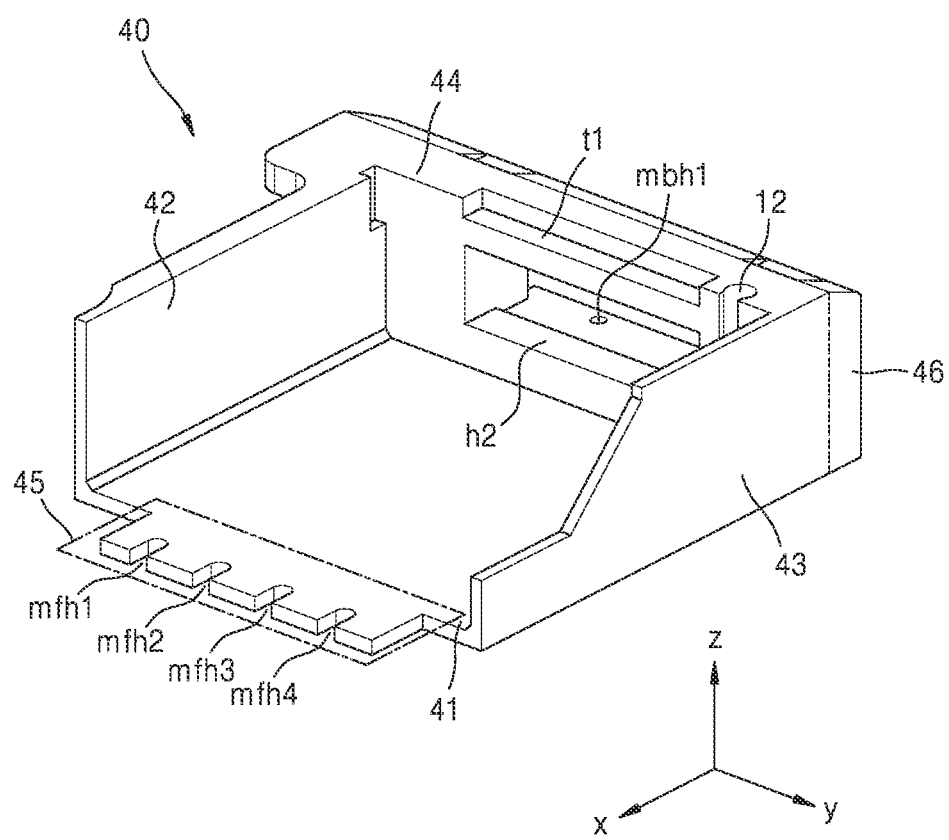
FIG. 8 is a perspective view of an example structure of a mount included in the transformer of FIG. 1.

The mount 40 may form a predetermined space in which the printed circuit board 20 may be mounted. Referring to FIG. 8, the mount 40 may include a base 41 adjacent to the bottom surface of the printed circuit board 20, a first left side wall 42 and a first right side wall 43 upwardly extending at left and right ends of the base 41 to be adjacent to a left side surface and a right side surface of the printed circuit board 20, respectively, a rear wall 44 upwardly extending on a rear side (the −x direction) of the base 41 and including a mount opening h2 into which a portion of the printed circuit board 20 may be inserted, and a front protrusion structure 45 extending from a front end (the x direction) of the base 41 in a front direction (the x direction) and including the fixing grooves mfh1, mfh2, mfh3, and mfh4.

The rear wall 44 may be provided between the first left side wall 42 and the first right side wall 43. The mount opening h2 formed in the rear wall 44 may have a sufficient size for the end of the printed circuit board 22, in which the first and second secondary via-holes bh1 and bh2 are formed, to be inserted. A step-difference structure t1 may be formed on the rear wall 44. The first insertion portion 33 of the insulating block 30 may be inserted into the step-difference structure t1. The step-difference structure t1 may have a shape corresponding to the first insertion portion 33, so that the first insertion portion 33 may be inserted into the step-difference structure t1. Also, an insertion groove t2 may be formed on a front surface of the rear wall 44 to extend from the top to the bottom. For example, the insertion groove t2 having a shape corresponding to the second insertion portion 34 of the insulating block 30 may be formed on the front surface of the rear wall 44, so that the second insertion portion 34 may be inserted into the insertion groove t2.

Because the first insertion portion 33 and the second insertion portion 34 of the insulating block 30 may be inserted into the step-difference structure t1 and the insertion groove t2, respectively, formed in the rear wall 44 of the mount 40, the insulating block 30 may be stably mounted on the mount 40.

The front protrusion structure 45 may include a flat structure extending from a front end (the x direction) of the base 41. The front protrusion structure 45 may be adjacent to the first through fourth primary via-holes fh1, fh2, fh3, and fh4, while a portion of the printed circuit board 20 may be inserted into the mount opening h2. The fixing grooves mfh1, mfh2, mfh3, and mfh4 which the first through fourth primary pins fp1, fp2, fp3, and fp4 coupled to the printed circuit board 20 may penetrate may be formed on the front protrusion structure 45. The fixing grooves mfh1, mfh2, mfh3, and mfh4 may have a U shape that is open in a direction crossing a direction in which the first through fourth primary pins fp1, fp2, fp3, and fp4 may penetrate the fixing grooves mfh1, mfh2, mfh3, and mfh4. For example, the fixing grooves mfh1, mfh2, mfh3, and mfh4 may be formed such that the first through fourth primary pins fp1, fp2, fp3, and fp4 may penetrate the fixing grooves mfh1, mfh2, mfh3, and mfh4 from a top direction (a z direction) to a bottom direction (a −z direction), and the fixing grooves mfh1, mfh2, mfh3, and mfh4 may have the U shape that is open in the front direction (the x direction) so that the first through fourth primary pins fp1, fp2, fp3, and fp4 may be inserted from the front direction (the x direction) to the rear direction (the −x direction).

Figure 9:
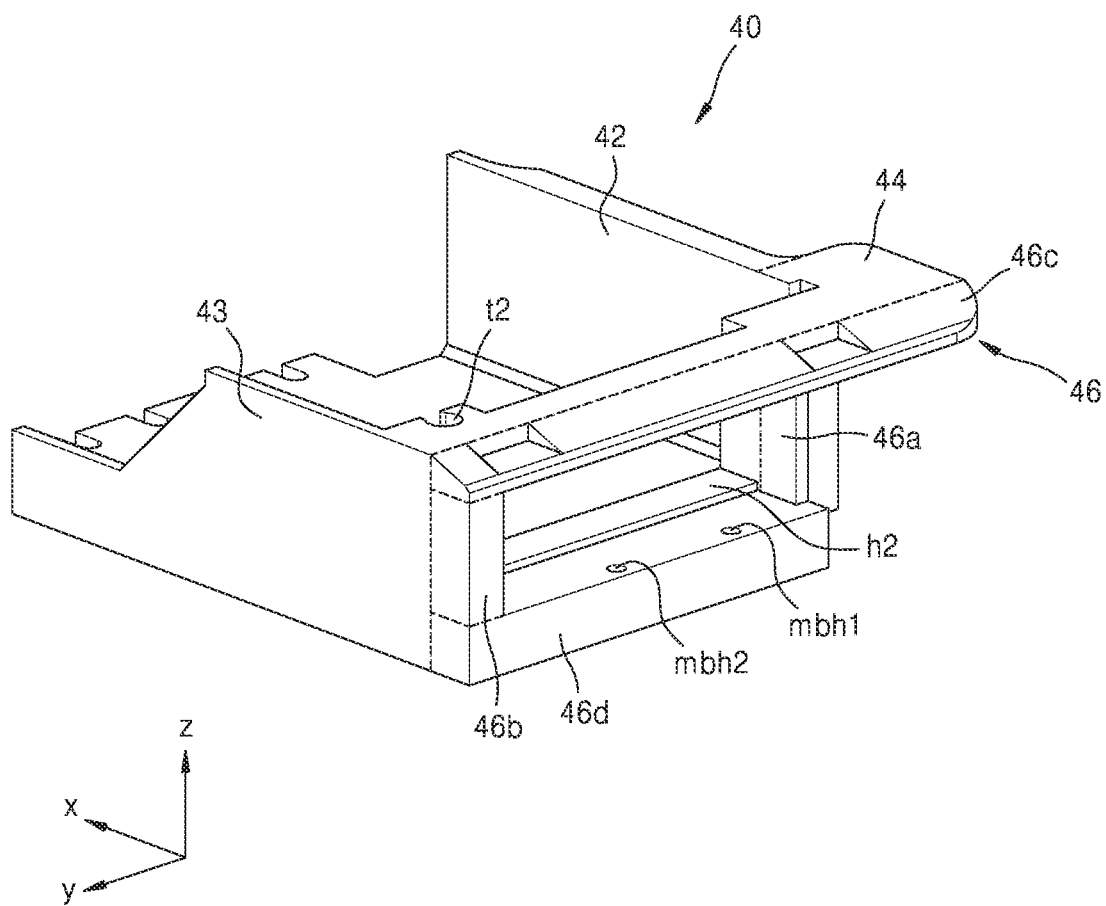
FIG. 9 is a perspective view of an example structure of a rear protrusion structure included in the mount of FIG. 8.

The mount 40 may further include a rear protrusion structure 46 extending from the rear wall 44 in a rear direction (the −x direction) so as to form a space for accommodating a portion of the printed circuit board 20, the portion being inserted into the mount opening h2 of the rear wall 44 and protruding in the rear direction (the −x direction). For example, referring to FIG. 9, the rear protrusion structure 46 may include a second left side wall 46a and a second right side wall 46b respectively extending on left and right sides of the rear wall 44 in the rear direction (the −x direction) and an upper wall 46c and a lower wall 46d respectively extending on upper and lower portions of the rear wall 44 in the rear direction (the −x direction).

The upper wall 46c of the rear protrusion structure 46 may be inclined from the rear wall 44 in a lower direction.

Through-holes mbh1 and mbh2 may be formed on the lower wall 46d of the rear protrusion structure 46 so that the secondary pins (bp1 and bp2 of FIG. 11) which may be included in the printed circuit board 20 as described below may be inserted into the through-holes mbh1 and mbh2. For example, the through-holes mbh1 and mbh2 may be formed such that the secondary pins bp1 and bp2 may be inserted into the through-holes mbh1 and mbh2 from the top direction (the z direction) to the bottom direction (the −z direction).

Figure 10:
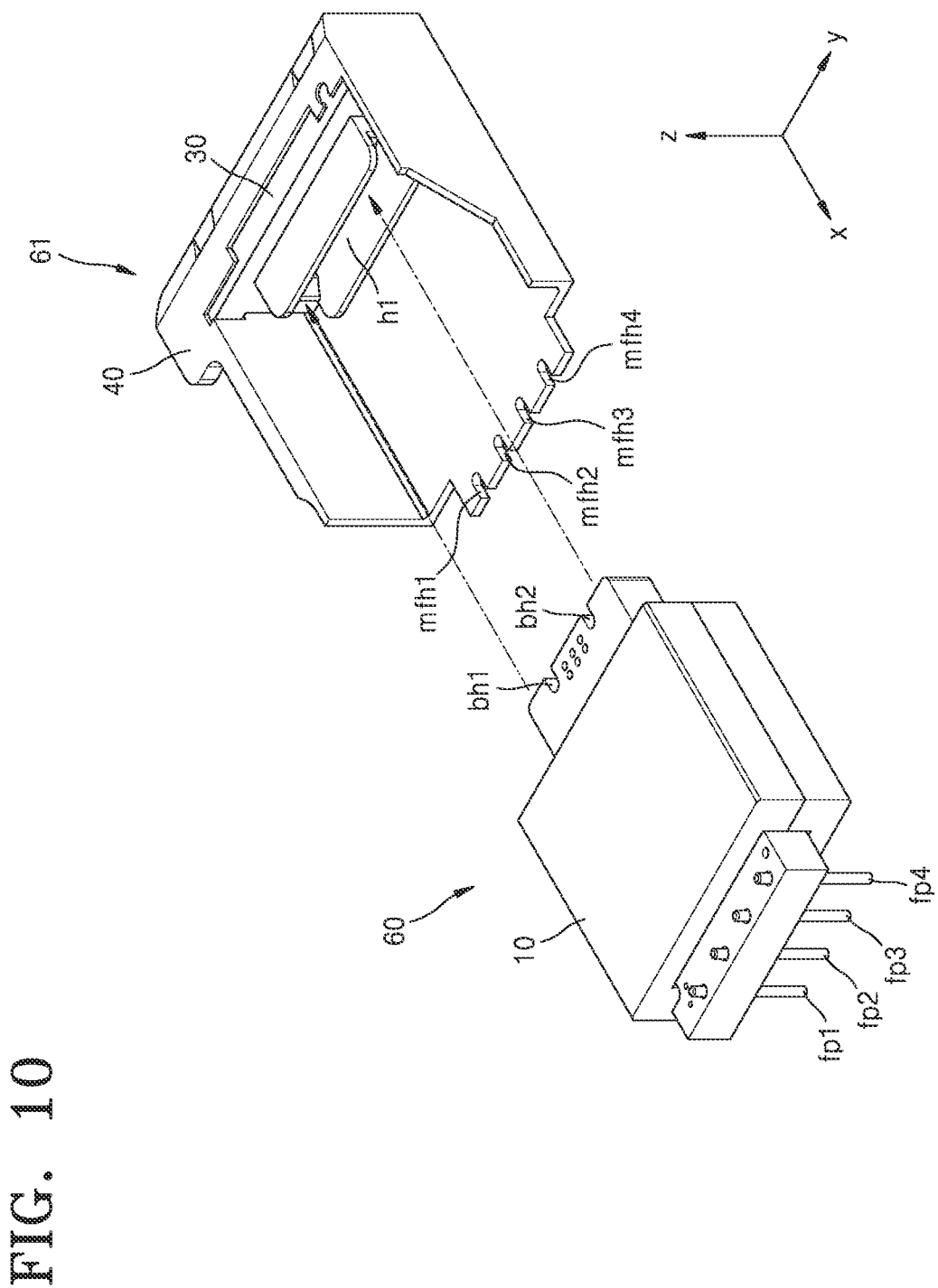
FIG. 10 is a perspective view for describing coupling of the first assembly of FIG. 6 and a second assembly in which the insulating block of FIG. 7 and the mount of FIG. 8 are coupled to each other.

Referring to FIG. 10, a second assembly 61 may be formed by coupling the insulating block 30 with the mount 40. The first assembly 60 and the second assembly 61 may be coupled to each other by inserting the end of the printed circuit board 20, in which the first and second secondary via-holes bh1 and bh2 are formed, into the block opening h1 of the insulating block 30 from the front (the x direction) to the rear (the −x direction). As described above, in a process in which the first assembly 60 and the second assembly 61 are coupled to each other, the first through fourth primary pins fp1, fp2, fp3, and fp4 may be inserted into the fixing grooves mfh1, mfh2, mfh3, and mfh4 from the front (the x direction) to the rear (the −x direction).

Unlike this, when, after the printed circuit board 20 is mounted on the mount 40, the first through fourth primary pins fp1, fp2, fp3, and fp4 are inserted into the fixing grooves mfh1, mfh2, mfh3, and mfh4 and the first through fourth primary via-holes fh1, fh2, fh3, and fh4, and a soldering process is performed on the first through fourth primary pins fp1, fp2, fp3, and fp4, electrical connection between the first through fourth primary pins fp1, fp2, fp3, and fp4 and the primary coil included in the printed circuit board 20 may become unstable in the soldering process. As illustrated in FIG. 10, when the first through fourth primary pins fp1, fp2, fp3, and fp4 are inserted into the mount 40 through the fixing grooves mfh1, mfh2, mfh3, and mfh4 that are open in the front direction (the x direction) in a state in which the first through fourth primary pins fp1, fp2, fp3, and fp4 are coupled to the printed circuit board 20 via a soldering process, the transformer 100 may be assembled while maintaining stable electrical connection between the first through fourth primary pins fp1, fp2, fp3, and fp4 and the primary coil included in the printed circuit board 20.

Figure 11:
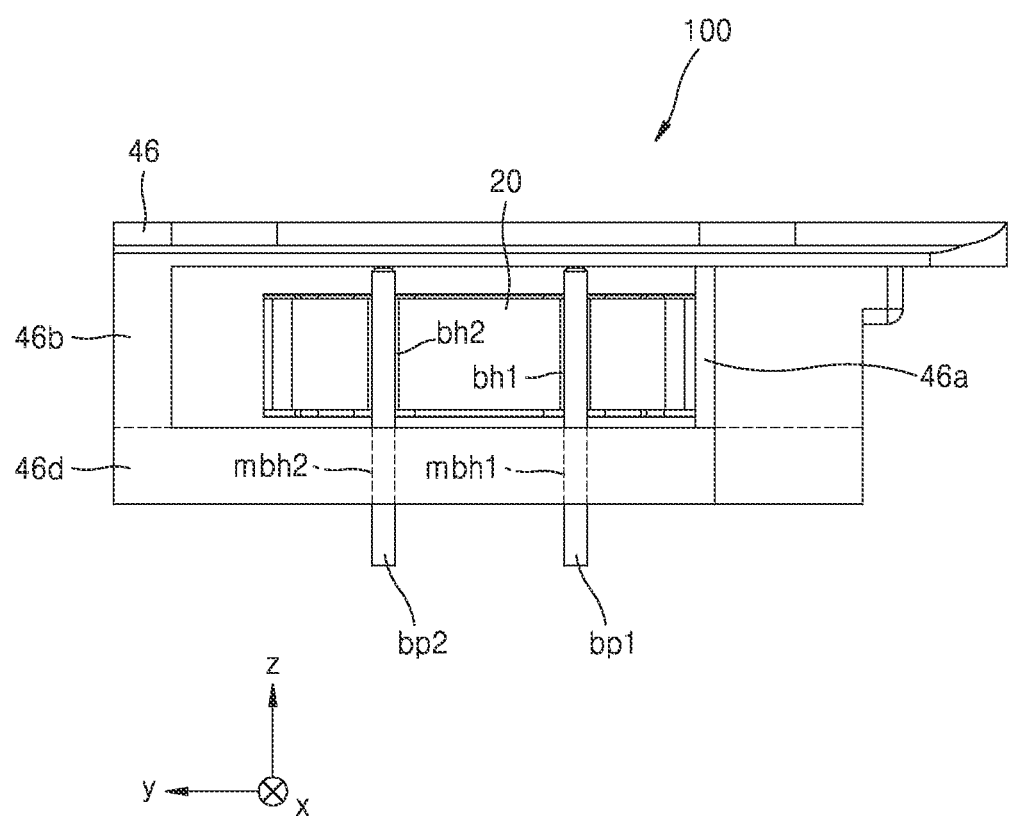
FIG. 11 is a view of a rear portion of the transformer of FIG. 1.

Referring to FIG. 11, the secondary pins bp1 and bp2 may be inserted into the first and second secondary via-holes bh1 and bh2 of the printed circuit board 20. Also, the through-holes mbh1 and mbh2 may be formed in the lower wall 46d of the mount 40 so that the secondary pins bp1 and bp2 may be inserted into the through-holes mbh1 and mbh2. The secondary pins bp1 and bp2 may be sequentially inserted into the through-holes mbh1 and mbh2 and the first and second secondary via-holes bh1 and bh2 from the bottom (the −z direction) to the top (the z direction), after the first assembly 60 and the second assembly 61 are coupled to each other. Thereafter, an adhesion member, such as a solder material, etc., may be applied into an empty space between the first and second secondary via-holes bh1 and bh2 and the secondary pins bp1 and bp2.

Figure 12:
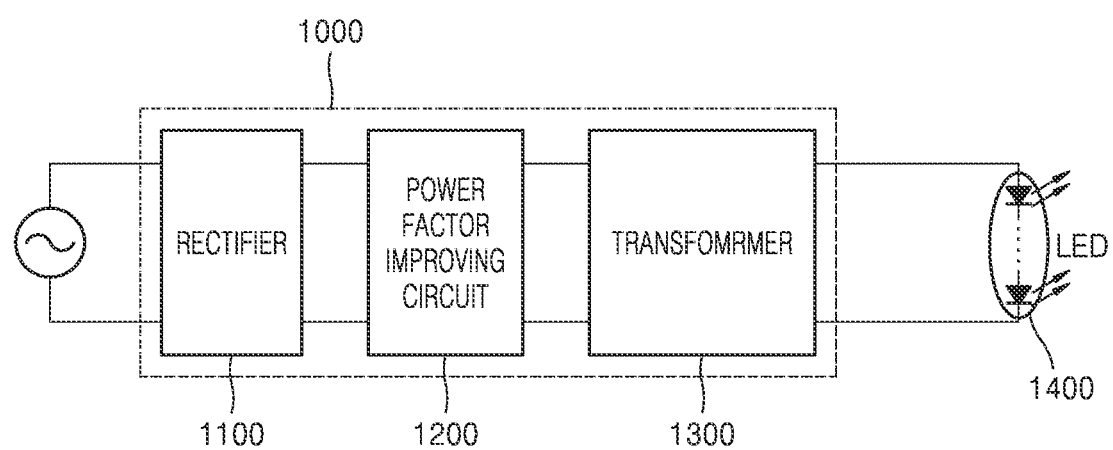
FIG. 12 is a block diagram of an example structure of a power supplying device according to an embodiment.

FIG. 12 is a block diagram of an example structure of a power supplying device 1000 according to an embodiment.

Referring to FIG. 12, the power supplying device 1000 may include a rectifier 1100 configured to rectify an alternating current voltage applied from the outside, a transformer 1300 configured to modulate the voltage rectified by the rectifier 1100, and a power factor improving circuit 1200 configured to improve a power factor with respect to the transformer 1300.

The rectifier 1100 may rectify and output an alternating current voltage applied from an external alternating current power device. For example, the rectifier 1100 may include a bridge rectifier. However, the rectifier 1100 is not limited thereto, and the rectifier 1100 may include various types of rectifiers configured to rectify an alternating current voltage.

The power factor improving circuit 1200 may include a coil structure configured to improve a power factor with respect to the transformer 1300, in order to maximize the transformation efficiency of the transformer 1300. For example, the power factor improving circuit 1200 may include a plurality of coil structures or a single coil structure. The coil structure included in the power factor improving circuit 1200 may include an inductor coil having a predetermined inductance, a detection coil configured to detect a current change of the inductor coil, and a bobbin in which the inductor coil and the detection coil are mounted. Also, the coil structure may further include a magnetic structure passing the centers of the inductor coil and the detection coil. The power factor improving circuit 1200 may have a predetermined inductance, may be electrically connected to the transformer 1300, and may improve the power factor with respect to the transformer 1300.

When a current change occurs in the inductor coil, a change in magnetic flux may occur in the magnetic structure, and this change in magnetic flux may generate an induced electromotive force in the detection coil. By measuring the induced electromotive force generated in the detection coil, the current change in the inductor coil may be detected.

The power factor improving circuit 1200 may be electrically connected to the rectifier 1100 and the transformer 1300. For example, as illustrated in FIG. 12, the power factor improving circuit 1200 may be arranged between the rectifier 1100 and the transformer 1300. However, the power factor improving circuit 1200 is not limited thereto and may be provided to be apart from the rectifier 1100 with the transformer 1300 therebetween.

The transformer 1300 may modulate and output an alternating current voltage applied from an external alternating current power device and rectified by the rectifier 1100. The transformer 1300 may include the transformer 100 described with reference to FIGS. 1 through 11.

The transformer 1300 may include a primary coil and a secondary coil. The primary coil and the secondary coil of the transformer 1300 may be winded around the same magnetic structure. A change in magnetic flux occurring due to a current flowing in the primary coil may affect the secondary coil through the magnetic structure, and thus, an induced electromotive force may be generated in the secondary coil. According to a winding ratio between the primary coil and the secondary coil, a magnitude of the induced electromotive force generated in the secondary coil may vary. As described above, the transformer 1300 may adjust a magnitude of an output voltage by including the primary coil and the secondary coil each having a different winding ratio.

A light-emitting diode (LED) 1400 may be an example of a load, to which a voltage output from the power supplying device 1000 is applied, and may be a light-emitting device. For example, the LED 1400 may include a plurality of LEDs. The power supplying device 1000 may convert an alternating current voltage applied from the outside into a direct current voltage of a predetermined level and may output the direct current voltage to the LED 1400. However, it is not limited thereto. The voltage output from the power supplying device 1000 may be transmitted to various types of loads except for the LED 1400.

According to example embodiments of the disclosure, a transformer including a printed circuit board having improved electrical stability and a power supplying device including the transformer may be provided.

According to example embodiments of the disclosure, a transformer, according to which a fixing groove having an open side may be provided in a mount on which a printed circuit board is mounted, so that a primary pin fixedly coupled to the printed circuit board may be stably mounted on the mount, and a power supplying device including the transformer may be provided.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A transformer comprising:
   a magnetic core including a lower magnetic structure and an upper magnetic structure;
   a printed circuit board arranged between the lower magnetic structure and the upper magnetic structure and including a core hole through which a midsection of the magnetic core penetrates, a primary coil, a secondary coil, a primary via-hole formed at an end of the printed circuit board and electrically connected to the primary coil, and a secondary via-hole formed at another end of the printed circuit board and electrically connected to the secondary coil;
   a primary pin inserted into the primary via-hole;
   a secondary pin inserted into the secondary via-hole;
   an insulating block into which a portion of the printed circuit board is inserted; and
   a mount on which the printed circuit board and the insulating block are mounted, wherein the mount includes:
   a base facing a bottom surface of the printed circuit board; and
   a front protrusion structure extending forward from a front end of the base, on which the fixing groove is located, and
   wherein a fixing groove into which the primary pin is fitted is provided in the mount.

2. The transformer of claim 1, wherein the fixing groove includes a U shape.

3. The transformer of claim 1, wherein the mount includes:
   a first left side wall and a first right side wall upwardly extending on left and right ends of the base, respectively, to be adjacent to a left side surface and a right side surface of the printed circuit board; and
   a rear wall upwardly extending on a rear side of the base and including a mount opening into which the printed circuit board is inserted.

4. The transformer of claim 3, wherein the fixing groove has the open structure in the front direction at the front protrusion structure.

5. The transformer of claim 3, wherein the mount further includes a rear protrusion structure extending from the rear wall in a rear direction so as to form a space for accommodating a portion of the printed circuit board, the portion being inserted into the mount opening of the rear wall and protruding in the rear direction.

6. The transformer of claim 5, wherein the rear protrusion structure includes
   a second left side wall and a second right side wall respectively extending on left and right sides of the rear wall in the rear direction and an upper wall and a lower wall respectively extending on upper and lower portions of the rear wall in the rear direction, and
   a through-hole is provided in the lower wall and the secondary pin is inserted into the through-hole.

7. The transformer of claim 6, wherein the upper wall is inclined from the rear wall in a lower direction.

8. The transformer of claim 1, wherein the insulating block covers an area of the printed circuit board, the area being between the core hole and the secondary via-hole.

9. The transformer of claim 3, wherein the insulating block includes:

a flat vertical plate arranged in parallel with the rear wall and including a block opening into which the portion of the printed circuit board is inserted; and an insulating upper wall, an insulating lower wall, an insulating left side wall, and an insulating right side wall extending from the vertical plate in the front direction to surround the block opening.

10. The transformer of claim 9, wherein the insulating upper wall covers a first area between the core hole and the secondary via-hole on a top surface of the printed circuit board, and the insulating lower wall covers a second area between the core hole and the secondary via-hole on a bottom surface of the printed circuit board.

11. The transformer of claim 9, wherein a step-difference structure is provided on an upper portion of the rear wall, and the insulating block further includes a first insertion portion extending on an upper portion of a rear surface of the vertical plate in a rear direction so as to be inserted into the step-difference structure.

12. The transformer of claim 9, wherein an insertion groove is provided in a front surface of the rear wall to extend from the top to the bottom, and the insulating block further includes a second insertion portion protruding on a rear surface of the vertical plate in a rear direction and extending from top to bottom so as to be inserted into the insertion groove.

13. The transformer of claim 3, wherein the secondary via-hole has an open structure in a rear direction of the printed circuit board.

14. The transformer of claim 1, wherein an end of the printed circuit board at which the primary via-hole is provided protrudes from the magnetic core in a first direction, and another end of the printed circuit board at which the secondary via-hole is provided protrudes from the magnetic core in a second direction that is opposite to the first direction.

15. The transformer of claim 1, wherein the lower magnetic structure includes a first midsection, a first magnetic plate on which the first midsection is provided, and a pair of first side wall portions provided on the first magnetic plate to be apart from each other with the first midsection therebetween and to face each other, and the upper magnetic structure includes a second midsection, a second magnetic plate on which the second midsection is provided, and a pair of second side wall portions provided on the second magnetic plate to be apart from each other with the second midsection therebetween and to face each other.

16. The transformer of claim 15, wherein the first magnetic plate includes a first step-difference structure contacting a lower portion of the insulating block, and the second magnetic plate includes a second step-difference structure contacting an upper portion of the insulating block.

17. A power supplying device comprising:
a rectifier configured to rectify an alternating current voltage applied from outside; and
a transformer configured to modulate the voltage rectified by the rectifier,
wherein the transformer includes:
a magnetic core including a lower magnetic structure and an upper magnetic structure;
a printed circuit board arranged between the lower magnetic structure and the upper magnetic structure and including a core hole through which a midsection of the magnetic core penetrates, a primary coil, a secondary coil, a primary via-hole formed at an end of the printed circuit board and electrically connected to the primary coil, and a secondary via-hole formed at another end of the printed circuit board and electrically connected to the secondary coil;
a primary pin inserted into the primary via-hole;
a secondary pin inserted into the secondary via-hole;
an insulating block into which a portion of the printed circuit board is inserted; and
a mount on which the printed circuit board and the insulating block are mounted, wherein the mount includes:
a base facing a bottom surface of the printed circuit board; and
a front protrusion structure extending forward from a front end of the base, on which the fixing groove is located, and
wherein a fixing groove into which the primary pin is fitted is provided in the mount.

18. The power supplying device of claim 17, further comprising a power factor improving circuit configured to improve a power factor with respect to the transformer.

* * * * *